(12) United States Patent
Rodricks et al.

(10) Patent No.: US 6,791,091 B2
(45) Date of Patent: Sep. 14, 2004

(54) WIDE DYNAMIC RANGE DIGITAL IMAGING SYSTEM AND METHOD

(76) Inventors: Brian Rodricks, 307 Nonantum Dr., Newark, DE (US) 19711; Michael G. Hoffberg, 1420 Locust St., Apt. 7G, Philadelphia, PA (US) 19102

( * ) Notice: Subject to any disclaimer, the term of this patent is extended or adjusted under 35 U.S.C. 154(b) by 0 days.

(21) Appl. No.: 09/884,810

(22) Filed: Jun. 19, 2001

(65) Prior Publication Data

US 2002/0195566 A1 Dec. 26, 2002

(51) Int. Cl.$^7$ ............................................. G01T 1/64
(52) U.S. Cl. .............................. 250/370.09; 250/370.08
(58) Field of Search ....................... 250/370.09, 370.08; 378/58, 62, 98.8

(56) References Cited

U.S. PATENT DOCUMENTS

| | | | | |
|---|---|---|---|---|
| 5,313,066 A | | 5/1994 | Lee et al. | 250/370.09 |
| 5,319,206 A | * | 6/1994 | Lee et al. | 250/370.09 |
| 5,379,336 A | * | 1/1995 | Kramer et al. | 250/370.09 |
| 5,512,756 A | | 4/1996 | Bayer et al. | 250/370.13 |
| 5,528,043 A | | 6/1996 | Spivey et al. | 250/370.09 |
| 5,652,430 A | * | 7/1997 | Lee | 250/370.09 |
| 5,661,309 A | * | 8/1997 | Jeromin et al. | 250/370.09 |
| 5,812,191 A | | 9/1998 | Orava et al. | 348/308 |
| 5,869,837 A | | 2/1999 | Huang | 250/370.09 |
| 5,886,353 A | | 3/1999 | Spivey et al. | 250/370.09 |
| 6,094,473 A | | 7/2000 | Yu | 378/108 |
| 6,163,029 A | * | 12/2000 | Yamada et al. | 250/370.01 |
| 6,323,490 B1 | * | 11/2001 | Ikeda et al. | 250/370.07 |
| 6,330,303 B1 | * | 12/2001 | Yamane et al. | 250/370.09 |

* cited by examiner

*Primary Examiner*—Alebert Gagliardi
(74) *Attorney, Agent, or Firm*—Cooper & Dunham LLP

(57) ABSTRACT

A digital x-ray imaging device and method. The imaging device comprises a top electrode layer; a dielectric layer; a sensor layer comprising a photoconductive layer and a plurality of pixels, each pixel comprising a charge-collecting electrode; a thin film transistor (TFT) readout matrix connected to the charge-collecting electrodes; and a variable power supply adapted to provide a range of voltages between the top electrode layer and the TFT readout matrix. The variable power supply may comprise a programmable power supply. The method comprises varying the voltage between the top electrode layer and the TFT readout matrix of a TFT-based direct digital x-ray imaging device to provide an acceptable signal-to-noise ratio over a greater range of exposures than provided at a single voltage. The method may be particularly useful in non-destructive testing applications.

16 Claims, 6 Drawing Sheets

WIDE DYNAMIC RANGE DIGITAL IMAGING SYSTEM AND METHOD

FIELD OF THE INVENTION

This invention relates to digital imaging systems, and more particularly to a method for providing a wide dynamic range with acceptable signal-to-noise ratio in digital imaging systems and digital imaging systems operable for use with the method.

BACKGROUND OF THE INVENTION

Non-destructive testing may utilize a number of different technologies, including x-ray, ultrasound, and infra-red imaging. About 25% of all non-destructive testing examinations are currently performed using x-rays. Digital x-ray imaging devices, in particular, are useful for non-destructive imaging. The gamut of applications used in x-ray non-destructive testing covers a large energy spectrum from low KeV to MeV applications, for example from about 40 KeV to about 10 MeV, covering items such as printed circuit boards, wax casting, metal casting, turbine blades, rocket cones, and the like, without limitation. Thus, systems capable of providing large-area, high-resolution images over a wide dynamic range of energy levels are desirable for satisfactory performance in multiple applications.

The features of the objects examined during digital imaging are generally "photon limited," meaning that high radiation exposures are used so that low-contrast details can be differentiated. These applications range from low signal-to-noise ratio requirements to very high signal-to-noise ratio requirements. Typically, high image contrast is desired, which requires a high signal-to-noise ratio. The desire for high signal-to-noise ratio limits the number of applications for which a given system can be optimized. Thus, to optimally satisfy all the x-ray non-destructive testing applications, a range of imaging systems may be needed, as any one system currently cannot meet the signal-to-noise ratio requirements for the entire energy range.

Screen-film is the optimal standard of analog imaging against which digital systems are typically compared. Many digital x-ray systems currently in use and under development, some based upon charge-coupled device (CCD) technology, others based upon photostimulated storage phosphor technology, and still others based upon thin-film-transistor (TFT) technology, to name a few. Some of these digital systems are comparable to film in performance, but not over the entire range of applications.

It is desirable, therefore, to provide a method for controlling the dynamic range and signal-to-noise ratio of a digital x-ray system so that a single device may be used over a wide range of applications and energy levels. In particular, it is desirable to provide such method with respect to TFT-based digital x-ray systems.

SUMMARY OF THE INVENTION

The invention comprises a digital x-ray imaging device and method. The imaging device comprises a top electrode layer; a dielectric layer; a sensor layer comprising a photoconductive layer and a plurality of pixels, each pixel comprising a charge-collecting electrode; a thin film transistor (TFT) readout matrix connected to the charge-collecting electrodes; and a variable power supply adapted to provide a range of voltages between the top electrode layer and the TFT readout matrix. The variable power supply may comprise a programmable power supply, and may have approximately a 2:1 turndown ratio, such as providing a range of voltages between about 1.5 kV and about 3.0 kV.

For a digital x-ray imaging device such as that described above, the invention comprises a method for providing a broad dynamic range for the device. The method comprises varying the voltage between the top electrode layer and the TFT readout matrix to provide an acceptable signal-to-noise ratio over a greater range of exposures than provided at a single voltage. The method may be used for non-destructive testing of one or more objects, such as but not limited to printed circuit boards, wax castings, metal castings, turbine blades, and a rocket cones. The method may include providing a signal-to-noise ratio of at least about 50.

Figure 1:
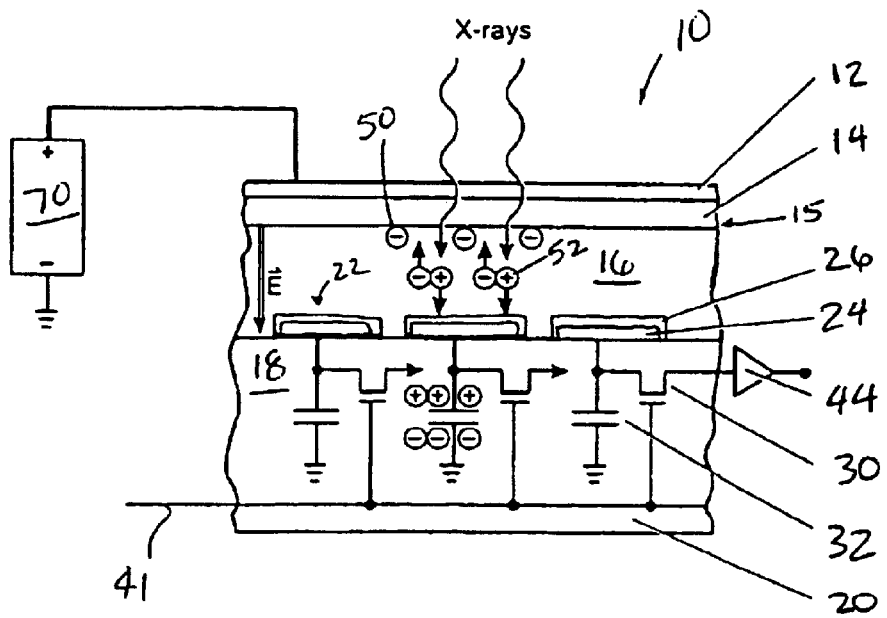
FIG. 1 is a cross-sectional illustration of an exemplary TFT-based detection system of this invention
Figure 2:
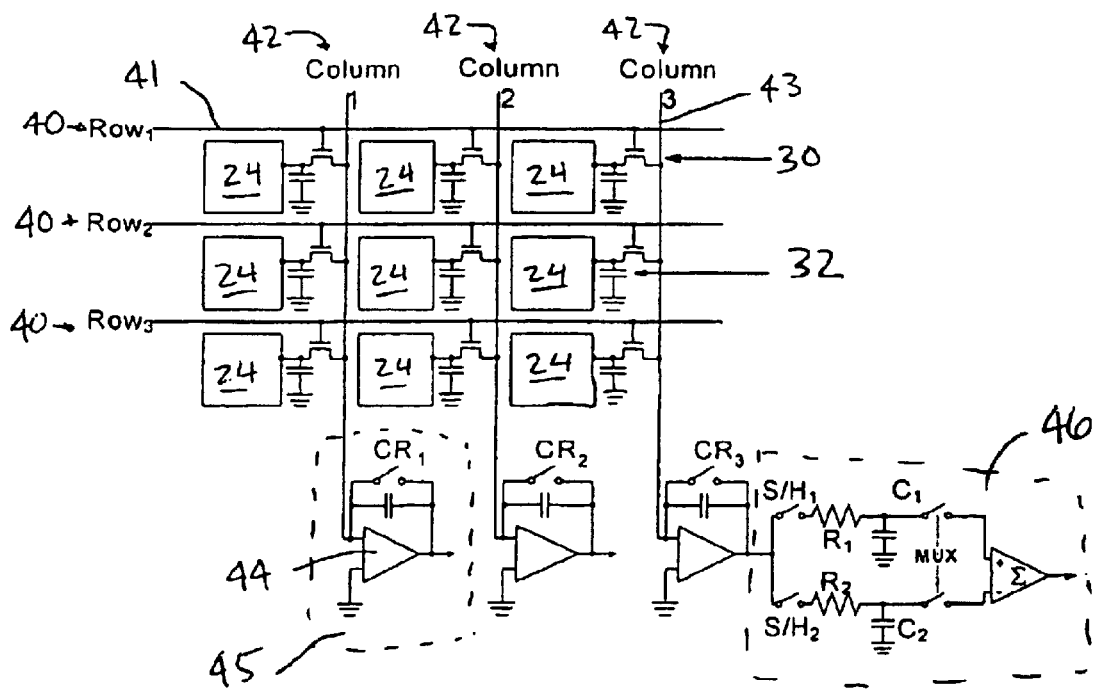
FIG. 2 is a schematic diagram of a two-dimensional arrangement of pixels and basic readout circuits.

Pixels 24 are arranged in a two-dimensional array, with rows 40 of gate control lines 41 and columns 42 of image-output lines 43 as shown in FIG. 2. A charge amplifier 44 and related charge integrator circuit 45 is attached to each image-output line, and connected to a correlated double-sampling circuit 46, as is well-know in the art. Each pixel element is electrically similar to a 3-capacitor series circuit as represented schematically by element 60 in FIG. 7. In operation, a bias electric field of up to about 10 volts per micron is created across the selenium layer by grounding the bottom of TFT array 18 and applying a high voltage to the top electrode 12, using power supply 70 (shown in FIG. 1). The detector is then exposed to x-rays as shown in FIG. 1. The resultant intensity-modulated x-ray flux generates electron-hole pairs in the selenium proportional to the amount of x-ray energy absorbed.

DESCRIPTION OF THE INVENTION

TFT digital x-ray systems are well-known in the art, for example as described in U.S. Pat. No. 5,313,066 issued to Lee et al., incorporated herein by reference. Thin-Film Technology (TFT) was initially developed for large-area electronic circuits used in Active Matrix Liquid Crystal Displays (AMLCDs). Unlike standard electronic components that are fabricated using crystalline silicon, TFT uses amorphous silicon and is deposited on glass substrates. Thus the devices can be fabricated arbitrarily large, the size being limited to that of the substrates. Unlike AMLCDs, which use TFT switches to turn on or off pixels, TFT-based digital imaging systems use TFT switches to readout signals from a pixel. There are two methods of image capture used in TFT-based digital imaging systems: indirect and direct conversion.

Indirect digital systems use indirect-conversion detectors where a scintillator, such as cesium iodide doped with thallium (CsI(Tl)), captures the x-ray energy and converts it to light. An array of thin-film diodes (TFDs) converts the light photons to electronic signals. These electronic signals are read using TFTs. Light scatter in the scintillator, however, may compromise image quality.

Direct digital systems do not suffer from the light scatter that is inherent in indirect systems. In direct systems, a photoconductor absorbs the X-rays and directly generates the electronic signal without intermediate steps that degrade image quality. Under the influence of an external electric field, the electronic signals drift towards a pixel electrode and are collected on a pixel capacitor. Because the electronic signals travel along electric field lines, there is no lateral movement of the charge. This results in an exceptionally narrow point spread response that is limited by the physical pixel size.

FIG. 1 is a cross-section of an exemplary TFT-based detection system 10 of this invention. Detection system 10 comprises an imaging array comprising a top electrode 12, a dielectric layer 14, and sensor 16 coupled to an amorphous silicon TFT readout matrix 18. The imaging array (elements 12–18) is typically mounted onto a glass substrate 20 for mechanical stability. Sensor 16 preferably comprises an x-ray semiconductor layer, such as but not limited to amorphous selenium (Se), lead iodide (PbI2), thallium bromide (TlBr), indium iodide (InI), cadmium telluride (CdTe), and other photoconductive materials, housing a plurality of pixels 24 (charge collecting electrodes) in a pixel matrix. Although the invention is described hereafter with respect to a selenium layer, it should be understood any of the other suitable compounds may be substituted. Each pixel 24 may have an electron-blocking layer 26 thereon. TFT readout matrix 18 comprises a plurality of TFTs 30 and signal storage capacitors 32. An exemplary detector 10 for use in a non-destructive testing application for example, may have an active imaging area measuring 14"×17", with a pixel matrix containing 3072×2560 pixels, each pixel measuring 139 $\mu$m×139 $\mu$m.

Figure 7:
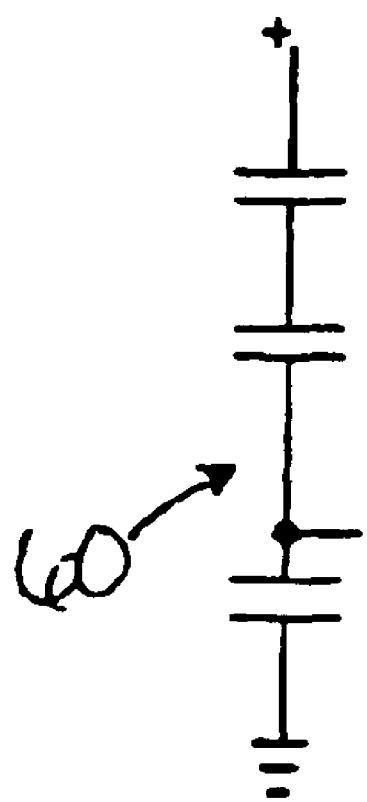
FIG. 7 shows schematically a 3-capacitor series circuit which is equivalent to the pixel element shown in FIG. 1.

FIG. 7 shows schematically a 3-capacitor series circuit which is equivalent to the pixel element shown in FIG. 1.

The biasing electric field separates the charge pairs, which then move along field lines mostly orthogonal to the surface. The selenium alloy, such as a alloy prepared by ANRAD, a subsidiary of Analogic of Peabody, Mass., for use in flat panel x-ray detectors, may be formulated to provide adequate mobility and long deep-trapping lifetime, so most charges transport through the semi-conductor thickness without recombination. Electrons 50 move directly upwards and accumulate at the selenium-dielectric interface 15. Holes 52 are pulled downward to the nearest pixel electrode atop the TFT-array structure, typically to one directly below the initial generation location. Every transported hole is collected by some pixel, and precise pixel-fabrication photolithography assures uniform charge collection. Because direct-conversion detectors involve only one image-forming conversion process, there are no additional processes to introduce pixel gain variations.

The electrons 50 that accumulate at selenium-dielectric interface 15 create an electric field that is opposed to the applied electric field. Thus, at very high input signals, the applied electric field is reduced, which limits the amount of charge that can accumulate on the storage capacitors 32 located at each pixel. This mechanism protects the TFT array from damage due to overexposure.

Figure 3:
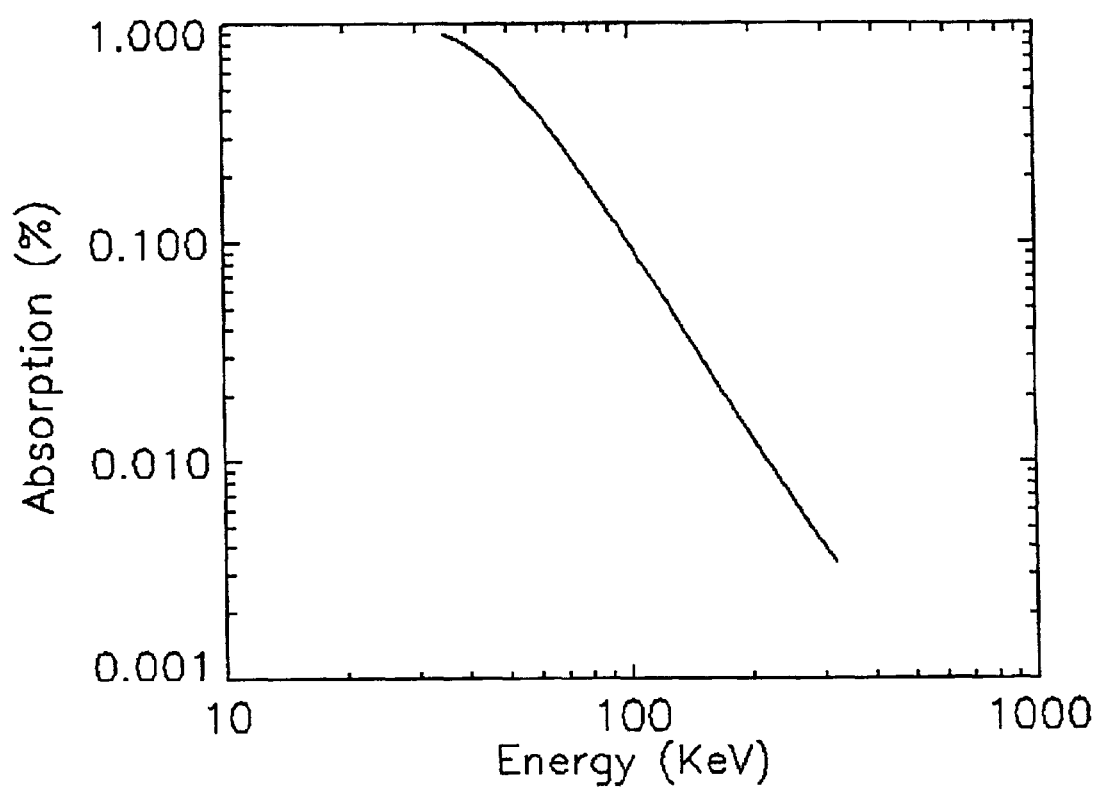
FIG. 3 is a graph of the absorption characteristics of a 500 $\mu$m thick selenium photoconductor as a function of input x-ray energy.

FIG. 3 shows a plot of absorption of x-rays in a 500 $\mu$m layer of selenium photoconductor as a function of x-ray energy. The absorption ranges from close to 100% at low energies to under 1% at energies above 300 KeV. The absorption efficiency can be improved by making the photoconductor layer thicker without compromising image quality.

The resolution properties of analog X-ray imaging systems have been extensively characterized using the modulation transfer function (MTF). MTFs in digital radiographic systems, however, may include a false response due to aliasing. In general, the overall MTF in a digital system can be expressed as:

$$MTF(u, v) = \left\{ [MTF_a(u, v) \times MTF_s(u, v)] * \sum_{m=-\infty}^{\infty} \sum_{n=-\infty}^{\infty} \delta\left(u - \frac{m}{\Delta x}, v - \frac{n}{\Delta y}\right) \right\} \times MTF_R(u, v)$$

where $MTF_a$ is the MTF of analog input, $MTF_s$ is the MTF of sampling pixel aperture, "*" denotes a convolution operation, and $MTF_R$ is the MTF due to the rest of the system such as filtering and display.

The product of ($MTF_a \times MTF_s$) is referred to as the presampling MTF of a digital system, and as such it contains the geometrical unsharpness, detection unsharpness, and sampling aperture unsharpness. The presampling MTF characterizes the inherent resolution capability of a digital system before sampling.

Figure 4:
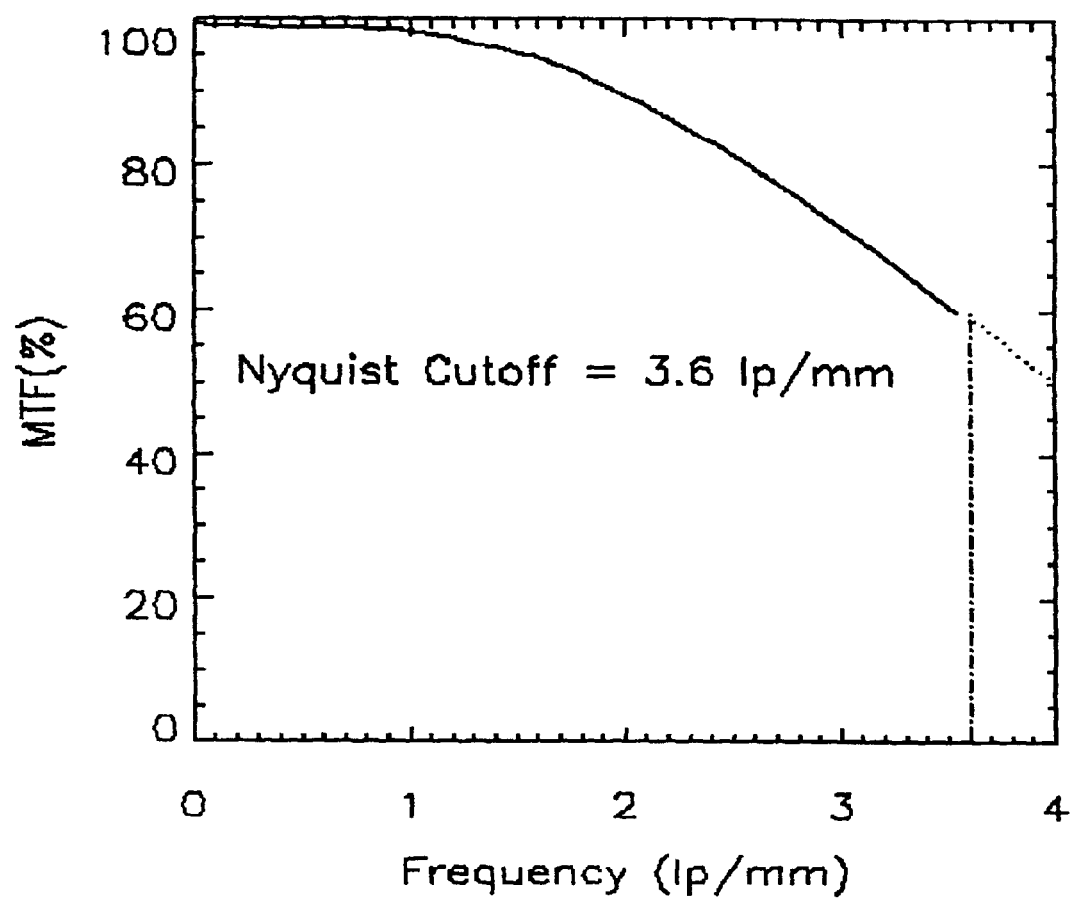
FIG. 4 is a graph of the presampling modulation transfer function (MTF) of an exemplary imaging array as a function of frequency measured in line pairs per millimeter (1p/mm).

FIG. 4 shows a graph of presampling MTF measured using a slightly angulated edge technique. Care was taken to generate a composite finely-sampled data set across the knife-edge to minimize the effect of aliasing on the MTF calculation. Minimization of noise was also necessary when taking the first derivative of the edge response to obtain the line spread function (LSF). The LSF was Fourier transformed to give the one-dimensional optical transfer function (OTF). The MTF was defined as the amplitude of the complex OTF (MTF=|OTF|). Several single-row MTFs were measured and the values then averaged. The presampling MTF as shown in FIG. 4 closely follows the theoretical value of the square pixel aperture MTF, indicating little degradation in resolution due to the use of a 500 $\mu$m layer of selenium. A selenium layer having a thickness in the range of about 100 to about 1000 microns is desirable.

Non-destructive testing applications are typically all signal-to-noise limited applications. The imaging performance is governed by measuring small changes in contrast, with typical changes being about 2%. To improve contrast, signal-to-noise ratio needs to be increased. A minimum signal-to-noise ratio of about 50 provides a 2% sensitivity. Scatter radiation compromises image quality and so, in practice, the signal-to-noise ratio may be significantly higher than 50. Most imaging systems are optimized to operate in certain energy ranges. This limits their performance in other energy ranges.

As described above, a bias voltage is applied across sensor layer 16 using power supply 70. X-rays that interact with the photoconductor in sensor layer 16 create electron-hole pairs that are separated by the applied electric field. The number of charges collected is a function of the applied field. As the field is increased, a higher signal is collected, with a correspondingly higher noise maintaining constant signal-to-noise ratio. There is a minimum field ($E_c$) required to assure that there is no loss in signal-to-noise ratio, but as the field is increased beyond this minimum, the signal-to-noise ratio remains constant. Thus, as the applied field is increased above $E_c$, the digital electronic saturation point decreases, decreasing the dynamic range. Therefore, a single imaging system of this invention having a programmable applied field can satisfy many applications. Thus, imaging system 10 of this invention has a programmable high voltage power supply 70 that can provide the programmable applied field.

Figure 5:
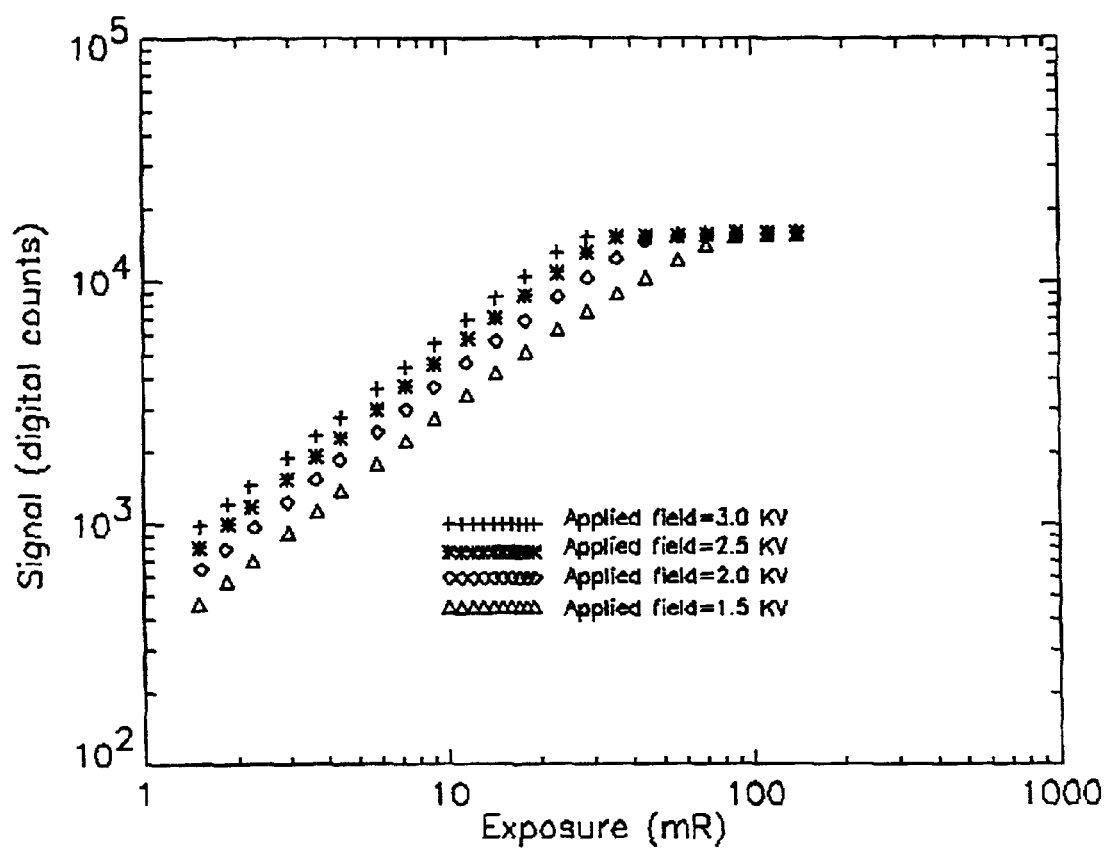
FIG. 5 is a graph of input-output transfer characteristics as a function of high voltage over a range of input exposure intensities in mR.

FIG. 5 shows a plot of the input-output transfer characteristics (digital counts vs. exposure in mR) as a function of applied high voltage. As shown in FIG. 5, as the high voltage is changed from 3.0 kV to 1.5 kV, the saturation point changes from 25 mR to 75 mR, thus producing a 3× increase in linear range.

Figure 6:
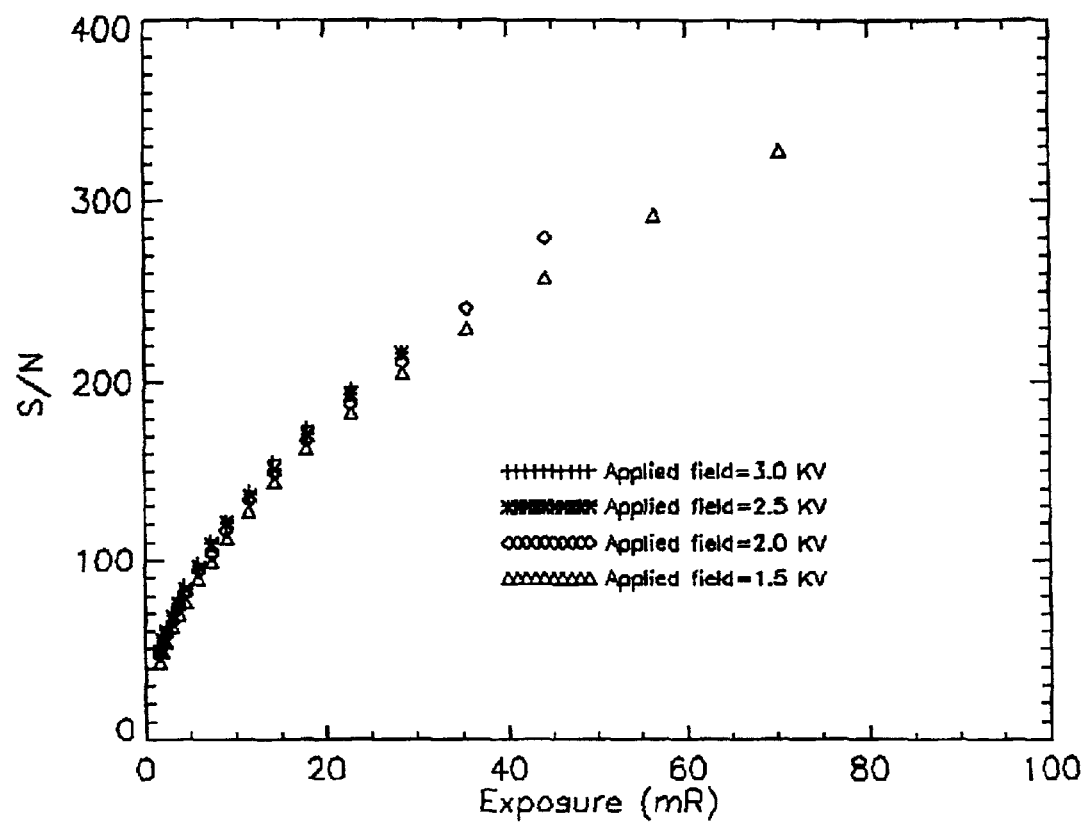
FIG. 6 is a graph of signal-to-noise ratio (SNR) as a function of high voltage over a range of input exposure intensities in mR.

FIG. 6 is a plot of signal-to-noise ratio at different exposure levels as a function of high voltage. As the high voltage is reduced from 3.0 kV to 1.5 kV, the signal-to-noise ratio increases from 180 to 330 before saturation. At an applied voltage of 1.5 kV, there is a loss of signal that reduces the signal-to-noise ratio by a few percent. A power supply having a range between about 1.5 kV to about 3.0 kV is desirable because it enables use with a range of x-ray energies from about 10 KeV to about 10 MeV, which can accomodate a wide range of industrial non-destructive testing applications. The high voltage range provided by the variable power supply may extend to values greater than 3.0 kV or less than 1.5 kV, however, and a power supply may have an operating range more or less inclusive than the approximately 2:1 turndown ratio of the about 1.5 to about 3.0 kV range described herein. As used herein, the term "turndown ratio" refers to the ratio of the highest voltage in the range of voltages provided by the power supply to the lowest voltage in the range.

Thus, as described above, a digital imaging system, such as a selenium-photoconductor-based medical digital imaging system, may been designed and optimized to provide a large area, high spatial resolution and wide dynamic range, making the system particularly useful for non-destructive testing applications. By varying the electric field applied across the photoconductor, the signal-to-noise behavior can be modified so that the device covers most x-ray non-destructive testing applications. The device is useful for non-destructive testing in all industrial applications, such as printed circuit boards, wax casting, metal casting, turbine blades, rocket cones, and the like. The list of possible industries and products that can benefit from this invention is endless. Reducing scatter radiation may provide improved image contrast. Although particularly useful for non-destructive testing, the digital imaging system of the present invention is not limited to any particular use.

Programmable power supply 70 comprises essentially a variable voltage supply and a programmable controller for the voltage supply. The programmable controller may be linked to software into which a user may input certain data about the specimen to be imaged with the x-ray system (such as thickness, materials of construction, and the like) from which the software may calculate a voltage setting. Ascertaining the proper voltage for a certain type of specimen may require further trial and error, and thus, the programmable controller may allow a number of preset settings to be saved for use in conjunction with each type of specimen. Thus, for example, if the same imaging unit is used for a number of different items routinely, each type of item may have its own saved setting that can be recalled upon demand.

Although use of a programmable controller in conjunction with a variable power supply is desirable, the variable power supply may be manually controlled, and may, for example, have a digital or analog indicator that a user may use to set the voltage at a desired setting. Thus, the calculation of a optimum voltage as a starting point and the saving of preferred voltages for certain specimens may be done manually by the user instead of using software.

It is obvious that those skilled in the art having the benefit of the above description can make numerous modifications particularly as to the actual numerical values used in the examples given above. Any such modifications are to be construed as encompassed within the scope of the invention as claimed herein below.

What is claimed is:

1. A digital imaging device comprising:
   a top electrode layer;
   a dielectric layer under the top electrode layer;
   a sensor layer under the dielectric layer, comprising a photoconductive layer and a plurality of pixels, each pixel comprising a charge-collecting electrode;
   a thin film transistor readout matrix connected to the charge-collecting electrodes; and
   a variable power supply including a programmable controller,
   wherein the variable power supply under programmed control of the programmable controller provides voltages between the top electrode layer and the readout matrix of 3.0 kV to 1.5 kV, said voltages establishing electrical fields in said sensor layer between a minimum electrical field $E_c$, at which a signal-to-noise ratio of the device is relatively high but the device operates below a saturation point, and a higher electrical field E, at which the signal-to-noise ratio may be lower but is at least 50, and
   said programmable controller controls said variable power supply to provide a selected voltage between 3.0 kV and 1.5 kV suitable for attaining a desired signal-to-noise ratio for a selected object being imaged with said digital imaging device.

2. The digital x-ray imaging device of claim 1 wherein the variable power supply comprises a programmable power supply.

3. The digital x-ray imaging device of claim 1 wherein the photoconductive layer comprises an element selected from the group consisting of: selenium, lead iodide, thallium bromide, indium iodide, and cadmium telluride.

4. The digital x-ray imaging device of claim 3 wherein the photoconductive layer is about 100 to about 1000 microns thick.

5. The digital x-ray imaging device of claim 4 wherein the photoconductive layer comprises a layer of selenium about 500 microns thick.

6. A method for providing a broad dynamic range for a digital imaging device and controlling a signal-to-noise behavior of the device to maintain a signal-to-noise ratio of at least 50 and prevent saturation of the device, said device comprising a top electrode layer; a dielectric layer; a sensor layer comprising a photoconductive layer and a plurality of pixels, each pixel comprising a charge-collecting electrode; a thin film transistor readout matrix connected to the charge-collecting electrodes; and a programmable controller programmed to control a power supply to supply a selected voltage between the top electrode layer and the readout matrix; the method comprising varying the voltage between the top electrode and the readout matrix between 3.0 kV and 1.5 kV to provide signal-to-noise ratio of at least 50 over a range of exposures; said step of varying said voltage comprising varying the voltage to establish clerical fields in said sensor between a minimum electrical field $E_c$ at which the device has a relatively high signal-to-noise ratio but still remains below a saturation point, and a higher electrical field $E_c$ at which the device has a signal-to-noise ratio that may be lower but still is at least 50, and said varying further comprising ultimately setting said voltage at a level within said range suitable for attaining a desired signal-to-noise ratio for an object being examined with said device.

7. The method of claim 6 further comprising using the method for non-destructive testing of one or more objects.

8. The method of claim 7 further comprising performing the non-destructive testing on an object selected from the group consisting of: a printed circuit board, a wax casting, a metal casting, a turbine blade, and a rocket cone.

9. The method of claim 6 comprising varying the voltage in a range between about 1.5 kV and about 3.0 kV.

10. The method of claim 6 comprising using the digital imaging x-ray device with a range of x-ray energies from about 10 KeV to about 10 MeV.

11. A method of operating a digital imaging device to image an object in a non-destructive testing process, said digital imaging device comprising a top electrode layer, a sensor layer comprising a photoconductive layer and a plurality of pixels, each pixel comprising a charge-collecting electrode, a thin film transistor readout matrix connected to the charge-collecting electrodes, and a programmable controller programmed to control a power supply to supply a selected voltage between the top electrode layer and the readout matrix; the method comprising the steps of selectively varying the voltage between the top electrode and the readout matrix to provide a signal-to-noise ratio of at least 50 over a range of exposures and to select a voltage within said range that establishes an electrical field in said sensor layer of at least a minimum value $E_c$ and causes the digital imaging device to operate below a digital electronic saturation point, said selected voltage being suitable for attaining a selected signal-to-noise behavior for a selected object being imaged with said device in said non-destructive testing process.

12. A method as in claim 11 in which said voltage is in the range of 1.5 kV and 3.0 kV.

13. A method as in claim 12 in which the signal-to-noise ratio increases from below 200 to above 300 before said saturation point is reached as said voltage changes from 3.0 kV to 1.5 kV.

14. A method as in claim 11 in which said selected voltage causes said minimum electrical field to corresponds to a signal-to-noise ratio in excess of 300.

15. A method as in claim 11 in which said selected signal-to-noise behavior is maintained at exposures in the range of 10 KeV to 10 MeV.

16. A method as in claim 11 including the step of presetting a number of selected voltages for use with respective types of specimen.

* * * * *